(12) United States Patent
Peidous et al.

(10) Patent No.: US 7,754,554 B2
(45) Date of Patent: Jul. 13, 2010

(54) METHODS FOR FABRICATING LOW CONTACT RESISTANCE CMOS CIRCUITS

(75) Inventors: Igor Peidous, Fishkill, NY (US); Patrick Press, Dresden (DE); Paul R. Besser, Sunnyvale, CA (US)

(73) Assignee: GlobalFoundries Inc., Grand Cayman (KY)

( * ) Notice: Subject to any disclaimer, the term of this patent is extended or adjusted under 35 U.S.C. 154(b) by 423 days.

(21) Appl. No.: 11/669,401

(22) Filed: Jan. 31, 2007

(65) Prior Publication Data

US 2008/0182370 A1 Jul. 31, 2008

(51) Int. Cl.
H01L 21/8238 (2006.01)

(52) U.S. Cl. .................. 438/199; 438/649; 438/651; 438/682; 438/683; 257/E21.199

(58) Field of Classification Search ......... 438/648–686, 438/199–234; 257/E21.199
See application file for complete search history.

(56) References Cited

U.S. PATENT DOCUMENTS

| | | | | |
|---|---|---|---|---|
| 4,394,673 A | * | 7/1983 | Thompson et al. | 257/478 |
| 5,504,376 A | * | 4/1996 | Sugahara et al. | 257/768 |
| 6,211,550 B1 | * | 4/2001 | Grebs et al. | 257/342 |
| 2007/0020930 A1 | * | 1/2007 | Lander et al. | 438/682 |

* cited by examiner

Primary Examiner—H. Jey Tsai
(74) Attorney, Agent, or Firm—Ingrassia Fisher & Lorenz, P.C.

(57) ABSTRACT

Methods for fabricating low contact resistance CMOS integrated circuits are provided. In accordance with an embodiment, a method for fabricating a CMOS integrated circuit including an NMOS transistor and a PMOS transistor disposed in and on a silicon-comprising substrate includes depositing a first silicide-forming metal on the NMOS and PMOS transistors. The first silicide-forming metal forms a silicide at a first temperature. At least a portion of the first silicide-forming metal is removed from the NMOS or PMOS transistor and a second silicide-forming metal is deposited. The second silicide-forming metal forms a silicide at a second temperature that is different from the first temperature. The first silicide-forming metal and the second silicide-forming metal are heated at a temperature that is no less than the higher of the first temperature and the second temperature.

19 Claims, 2 Drawing Sheets

METHODS FOR FABRICATING LOW CONTACT RESISTANCE CMOS CIRCUITS

FIELD OF THE INVENTION

The present invention generally relates to methods for fabricating CMOS circuits, and more particularly relates to methods for fabricating low contact resistance CMOS circuits utilizing dual metal silicides.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). An MOS transistor includes a gate electrode as a control electrode that is formed on a semiconductor substrate and spaced-apart source and drain regions formed within the semiconductor substrate and between which a current can flow. A control voltage applied to the gate electrode controls the flow of current through a channel in the semiconductor substrate between the source and drain regions. The ICs are usually formed using both P-channel FETs (PMOS transistors) and N-channel FETs (NMOS transistors) and the IC is then referred to as a complementary MOS or CMOS integrated circuit (IC).

There is a continuing trend to incorporate more and more circuitry on a single IC chip. To incorporate the increasing amount of circuitry, the size of each individual device in the circuit and the size and spacing between device elements (the feature size) must decrease. The individual elements of the circuits, that is, MOS transistors and other passive and active circuit elements, must be interconnected by metal or other conductors to implement the desired circuit function. Some small resistance is associated with each contact between the conductor and the circuit element. As the feature size decreases, the contact resistance increases and becomes a greater and greater percentage of the total circuit resistance. As feature sizes decrease from 150 nanometer (nm) to 90 nm, then to 45 nm and below the contact resistance becomes more and more important. At feature sizes of 32 nm, the contact resistance likely will dominate chip performance unless some innovation changes the present trend.

One solution for lowering contact resistance is to fabricate CMOS integrated circuits utilizing dual silicides, that is, different silicides for contact to the PMOS transistor and for contact to the NMOS transistor. In this regard, metal suicides that will exhibit lower potential barrier heights with respect to the doped semiconductor substrate can be used. Lower potential barrier height between a silicide and the doped semiconductor substrate results in lower contact resistance, which in turn results in lower total external resistance of the CMOS, and hence improved device performance. However, conventional methods for fabricating a CMOS integrated circuit using dual silicides requires forming the higher temperature silicide first, followed by forming the low temperature silicide. Protecting some transistors (and other devices) from silicidation while siliciding other transistors significantly complicates the fabrication process and may cause generation of various defects.

Accordingly, it is desirable to provide improved methods for fabricating CMOS integrated circuits that utilize different metal silicides for PMOS and NMOS transistors. In addition, it is desirable to provide methods for fabricating low contact resistance CMOS integrated circuits that reduce processing steps. It also is desirable to provide methods for fabricating low contact resistance CMOS integrated circuits that reduce defect generation during silicidation. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for fabricating a CMOS integrated circuit including an NMOS transistor and a PMOS transistor disposed in and on a silicon-comprising substrate includes depositing a first silicide-forming metal on the NMOS and PMOS transistors. The first silicide-forming metal forms a silicide at a first temperature. At least a portion of the first silicide-forming metal is removed from either the NMOS or PMOS transistor and a second silicide-forming metal is deposited. The second silicide-forming metal forms a silicide at a second temperature that is different from the first temperature. The first silicide-forming metal and the second silicide-forming metal are heated at a temperature that is no less than the higher of the first temperature and the second temperature.

In accordance with another exemplary embodiment of the present invention, a method for fabricating a CMOS integrated circuit including an NMOS transistor having N-type source and drain regions and a PMOS transistor having P-type source and drain regions comprises forming a first silicide-forming metal contacting the N-type source and drain regions and the P-type source and drain regions. An insulating layer is deposited overlying the first silicide-forming metal and a patterned mask is formed overlying one type of the N-type source and drain regions and the P-type source and drain regions. The insulating layer is removed from the other type of the N-type source and drain regions and the P-type source and drain regions. A buffer layer of the first silicide-forming metal is formed on the other type of the N-type source and drain regions and the P-type source and drain regions. A second silicide-forming metal is formed overlying the insulating layer and the buffer layer. The second silicide-forming metal forms a metal silicide at a second temperature that is lower than a first temperature at which the first silicide-forming metal forms a metal silicide. The first silicide-forming metal and the second silicide-forming metal are heated at a temperature that is no less than the first temperature.

In accordance with a further exemplary embodiment of the present invention, a method for fabricating a CMOS integrated circuit including an NMOS transistor disposed in and on a silicon-comprising substrate and a PMOS transistor disposed in and on the substrate includes depositing a first silicide-forming metal on the NMOS and PMOS transistors. The first silicide-forming metal forms a silicide at a first temperature. A insulating layer is deposited overlying the first silicide-forming metal and a mask is formed overlying the NMOS transistor. The insulating layer overlying the PMOS transistor is removed and a buffer layer of the first silicide-forming metal is formed overlying the PMOS transistor. The mask is removed and a second silicide-forming metal is formed overlying the insulating layer and the buffer layer. The second silicide-forming metal forms a metal silicide at a second temperature that is lower than the first temperature.

The first silicide-forming metal and the second silicide-forming metal are heated at a temperature no less than the first temperature.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 1-6 schematically illustrate, in cross section, a method steps for fabricating a CMOS integrated circuit 50 in accordance with various embodiments of the present invention. Various steps in the manufacture of MOS components are will known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
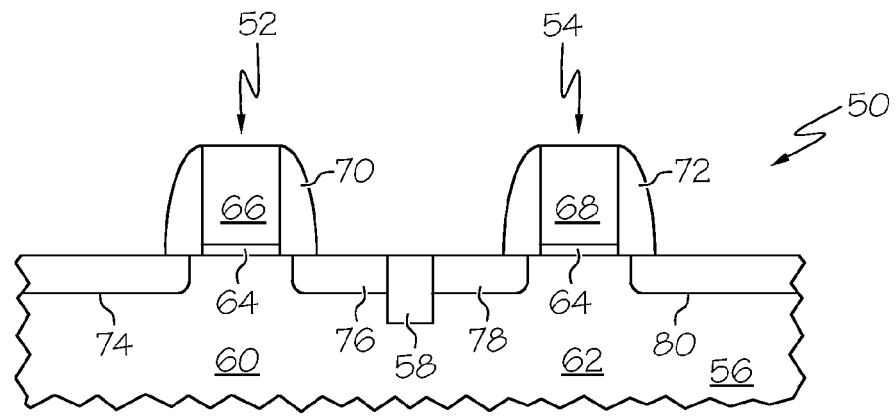
FIGS. 1-6 schematically illustrate, in cross section, a method for fabricating a CMOS integrated circuit that utilizes different metal silicides for PMOS and NMOS transistors, in accordance with an exemplary embodiment of the present invention.

CMOS IC 50 includes a plurality of N-channel MOS (NMOS) transistors 52 and P-channel MOS (PMOS) transistors 54, only one each of which are illustrated. Those of skill in the art will appreciate that IC 50 may include a large number of such transistors as required to implement a desired circuit function. The initial steps in the fabrication of IC 50 are conventional so the structure resulting from these steps is illustrated in FIG. 1, but the initial steps themselves are not shown. The IC is fabricated on a silicon substrate 56 which can be either a bulk silicon wafer as illustrated or a thin silicon layer on an insulating substrate (SOI). As used herein, the terms "silicon layer" and "silicon substrate" will be used to encompass the relatively pure or lightly impurity-doped monocrystalline silicon materials typically used in the semiconductor industry as well as silicon admixed with other elements such as germanium, carbon, and the like to form substantially monocrystalline semiconductor material. NMOS transistor 52 and PMOS transistor 54 are electrically isolated by a dielectric isolation region 58, preferably a shallow trench isolation (STI) region. As is well known, there are many processes that can be used to form the STI, so the process need not be described here in detail. In general, STI includes a shallow trench that is etched into the surface of the semiconductor substrate and that is subsequently filled with an insulating material. After the trench is filled with an insulating material such as silicon oxide, the surface is usually planarized, for example by chemical mechanical planarization (CMP).

At least a surface portion 60 of the silicon substrate is doped with P-type conductivity determining impurities for the fabrication of NMOS transistor 52 and another surface portion 62 is doped with N-type conductivity determining impurities for the fabrication of PMOS transistors 54. Portions 60 and 62 can be impurity doped, for example, by the implantation and subsequent thermal annealing of dopant ions such as boron and arsenic.

In the conventional processing, a layer of gate insulating material 64 is formed at the surface of the impurity-doped regions and gate electrodes 66 and 68 are formed overlying the gate insulating material and impurity-doped regions 60 and 62, respectively. The layer of gate insulating material can be a layer of thermally grown silicon dioxide or, alternatively (as illustrated), a deposited insulator such as a silicon oxide, silicon nitride, a high dielectric constant insulator such as HfSiO, or the like. Deposited insulators can be deposited, for example, by chemical vapor deposition (CVD), low pressure chemical vapor deposition (LPCVD), or plasma enhanced chemical vapor deposition (PECVD). Gate insulator layer 64 preferably has a thickness of about 1-10 nm, although the actual thickness can be determined based on the application of the transistor in the circuit being implemented. Gate electrodes 66 and 68 are preferably formed by depositing, patterning, and etching a layer of metal or polycrystalline silicon, preferably a layer of undoped polycrystalline silicon. The gate electrodes generally have a thickness of about 100-300 nm. The polycrystalline silicon can be deposited, for example, by the reduction of silane in a CVD reaction. After formation of gate electrodes 66 and 68, the gate electrodes can be used as etch masks during the etching of the layer of gate insulator material to form the gate insulators 64 underlying each gate electrode. Sidewall spacers 70 and 72 are formed on the sidewalls of gate electrodes 66 and 68, respectively. The sidewall spacers are formed by depositing a layer of insulating material such as silicon oxide and/or silicon nitride and subsequently anisotropically etching the insulating layer, for example by reactive ion etching (RIE). Silicon oxide and silicon nitride can be etched, for example, in a $CHF_3$, $CF_4$, or $SF_6$ chemistry. A layer of masking material, which can be, for example, a layer of photoresist is applied and patterned to expose one of the transistor structures. The masking material is patterned, for example to mask the PMOS transistor 54 structure and to expose the NMOS transistor 52 structure. Using the patterned masking material as an ion implantation mask, N-type conductivity determining ions are implanted into P-type portion 60 of the silicon substrate to form N-type source 74 and drain 76 regions in the silicon substrate and into gate electrode 66 to conductivity dope that gate electrode with N-type impurities. The implanted ions can be either phosphorus or arsenic ions. The patterned layer of masking material is removed and another layer of masking material, again a layer such as a layer of photoresist, is applied and is patterned to expose the other of the transistor structures. Using this second layer of patterned mask material as an ion implantation mask P-type conductivity determining ions such as boron ions are implanted into N-type portion 62 of the silicon substrate to form P-type source 78 and drain 80 regions in the silicon substrate and into gate electrode 68 to conductivity dope that gate electrode with P-type impurities. For each of the transistor structures, the ion-implanted source and drain regions are self aligned with the gate electrodes. As those of skill in the art will appreciate, additional sidewall spacers and additional implantations may be employed to create drain extensions, halo implants, deep source and drains, and the like. It will also be appreciated by those skilled in the art that the order of forming the source and drain regions of the N-channel and the P-channel MOS transistors can be reversed. After formation of the sidewall spacers 70 and 72, any remaining dielectric, such as oxide, can be removed from the source and drain regions. The oxide can be stripped, for example, using a diluted hydrofluoric (HF) acid solution or a dry etch process.

Figure 2:
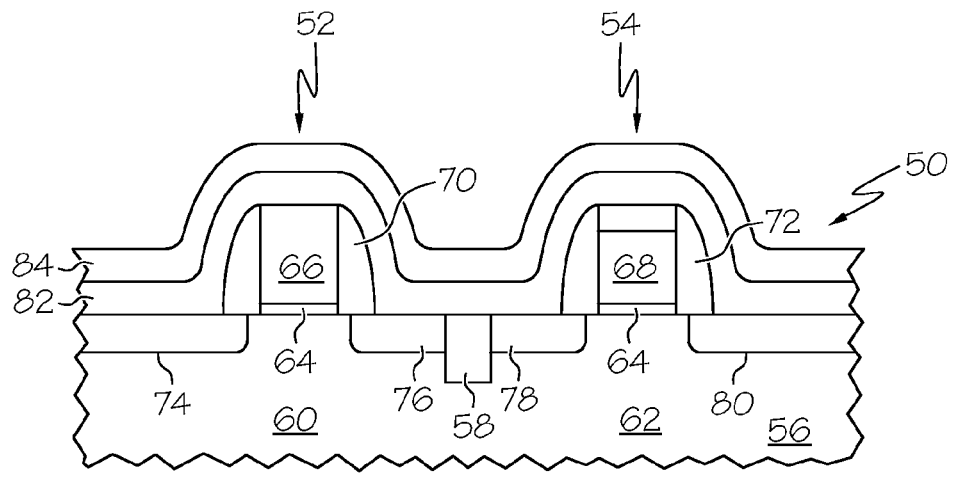

In accordance with an embodiment of the invention, a layer 82 of a first silicide-forming metal is deposited over the structure and in contact with the exposed portions of the source regions 74, 78 and drain regions 76, 80 and the gate electrodes 66, 68, as illustrated in FIG. 2. In an exemplary embodiment of the invention, the first silicide-forming metal can be any metal that exhibits a barrier height with respect to N-type silicon that is lower than the barrier height of nickel with respect to N-type silicon. In another exemplary embodiment of the invention, the first silicide-forming metal can be any metal that exhibits a barrier height with respect to N-type silicon that is less than about 0.4 eV. Silicide-forming metals that meet this criterion include, for example, dysprosium (Dy), erbium (Eb), holmium (Ho), lutetium (Lu), gadolinium (Gd), terbium (Tb), ytterbium (Yb), and yttrium (Y). In a preferred embodiment of the invention, the silicide-forming metal will provide a barrier height of less than about 0.3 eV. Silicide-forming metals that provide this barrier height include ytterbium and erbium. The first silicide-forming metal is deposited to a thickness in the range of about 5 nm to about 40 nm, preferably to a thickness of about 15 nm. The first silicide-forming metal can be deposited, for example, by plasma vapor deposition (PVD) or electrochemical deposition. An insulating film 84 then is deposited overlying the first silicide-forming metal 82. The insulating film 84 may be formed of any insulating material, such as a dielectric material, that is deposited at a temperature below which the first silicide-forming metal forms a silicide. In an exemplary embodiment, the insulating film 84 is an oxide film deposited by chemical vapor deposition (CVD) or PVD. The insulating film 84 is deposited to a thickness that provides a uniform and continuous layer, without a significant presence of pinholes or other defects. In an exemplary embodiment, the insulating film is deposited to a thickness of about 1 to about 5 nm.

Figure 3:
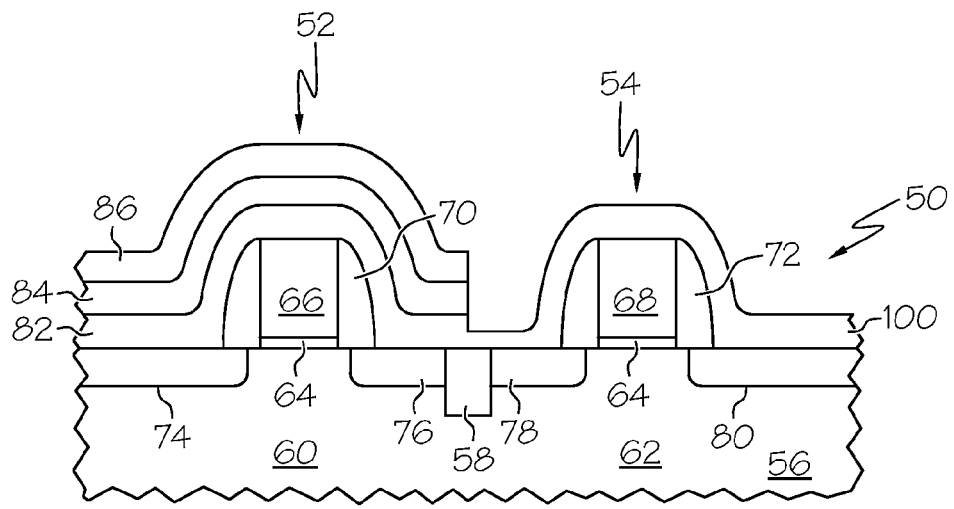

In accordance with an embodiment of the invention, a layer of masking material 86, such as a photoresist, is deposited overlying the structure and is patterned, such as by photolithography, as illustrated in FIG. 3. The layer of masking material is patterned to leave the material masking NMOS transistor 52. The patterned mask then is used as an etch mask and any exposed portions of insulating film 84 are removed. In one embodiment of the invention, a portion of the first silicide-forming metal 82 also is removed, leaving a thin layer 100 of the first silicide-forming metal overlying PMOS transistor 54. In an alternative embodiment of the invention, the entire first silicide-forming metal 82 is removed and a thin layer 100 of first silicide-forming metal is regrown overlying the gate electrode 68 and the source and drain regions 78 and 80 of PMOS transistor 54. The dielectric film 84 and the first silicide-forming metal 82 can be removed by, for example, RIE. The thin layer 100 of the first silicide-forming metal remaining or regrown on the source and drain regions 78 and 80 of the PMOS transistor 54 serves as a buffer layer 100 during subsequent annealing, as discussed in more detail below. The buffer layer of the first silicide-forming metal on PMOS transistor 54 has a thickness in the range of about 0.5 nm to about 2 nm, preferably about 1 nm.

Figure 4:
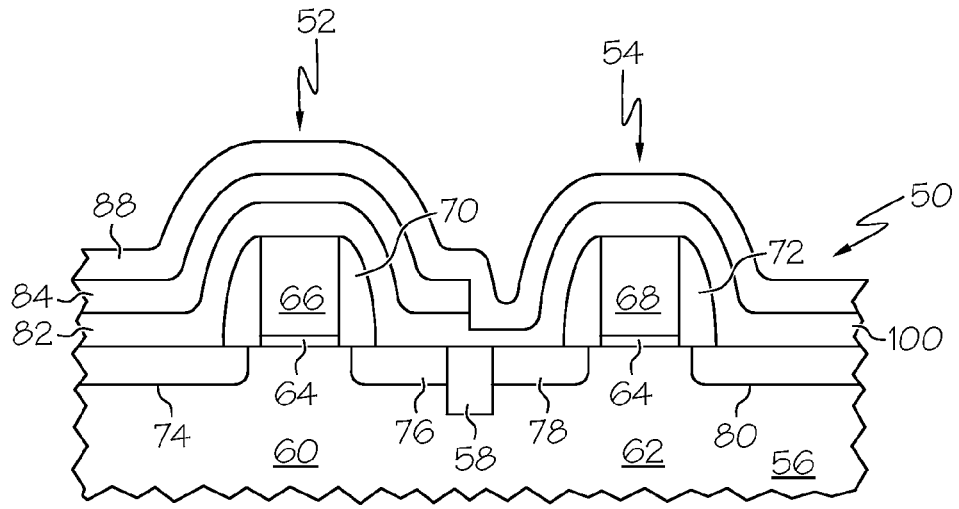

The patterned layer of masking material 86 is removed and a layer of second silicide forming metal 88 is deposited overlying the structure, as illustrated in FIG. 4. In an exemplary embodiment of the invention, the second silicide-forming metal can be any metal that is different from the first silicide-forming metal and that exhibits a barrier height with respect to P-type silicon that is equivalent to or higher than the barrier height of nickel with respect to P-type silicon, which is about 0.6 eV. In another exemplary embodiment of the invention, the second silicide-forming metal can be any metal that exhibits a barrier height with respect to P-type silicon that is greater than 0.6 eV. Silicide-forming metals that meet this criterion include, for example, iridium (Ir), osmium (Os), platinum (Pt), nickel (Ni), and alloys thereof. The second silicide-forming metal is deposited to a thickness in the range of about 5 nm to about 30 nm, preferably to a thickness of about 15 nm. The second silicide-forming metal can be deposited, for example, by PVD or electrochemical deposition.

Figure 5:
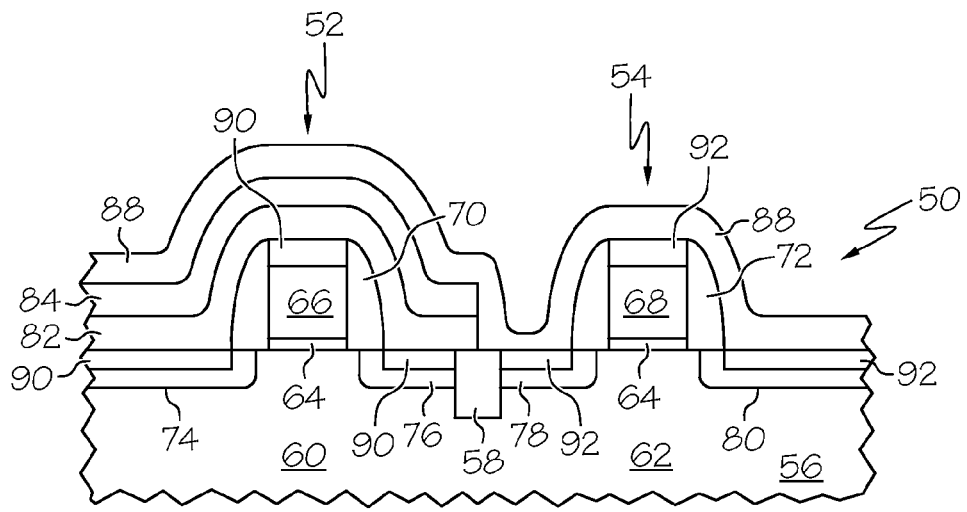

Referring to FIG. 5, the method continues with the heating of the structure, for example by rapid thermal annealing (RTA), to cause the silicide-forming metals to react with the silicon to form a first metal silicide 90 at the surface of the N-type source and drain regions 74 and 76 and a second metal silicide 92 at the surface of the P-type source and drain regions 78 and 80. If the gate electrodes 66 and 68 are formed of polycrystalline silicon, first metal silicide 90 also is formed at the surface of gate electrode 66 and second metal silicide 92 is formed at the surface of gate electrode 68. It will be appreciated that, because they are different materials, the first silicide-forming metal may form silicide at a temperature that is different from the temperature at which the second silicide-forming metal forms silicide. Accordingly, to cause both of the silicide-forming metals to react with the silicon in one step, the annealing process is performed at the higher of the two temperatures. In this regard, the fabrication process is shortened by eliminating an annealing step. For example, erbium forms silicide at temperatures no less than 500° C., while nickel forms silicide at temperatures of about 400° C. or less. Thus, annealing the silicide-forming metals at temperatures no less than 500° C. ensures that both silicide-forming metals form the respective silicides. However, annealing the second silicide-forming metal at the higher temperature may result in formation of undesirable phases of the second metal silicide. For example, annealing nickel at temperatures greater than 400° C. may result in the formation of phases of nickel silicide other than the desired NiSi, such as $NiSi_2$. Without wishing to be bound by theory, it is believed that the buffer layer 100 of the first silicide-forming metal forms a thin layer of first silicide overlying the P-type source and drain regions 78 and 80 upon commencement of the anneal process and facilitates control of the formation of the second metal silicide, such as nickel silicide, so that only the desirable phase forms at the source and drain regions 78 and 80. Nickel also tends to be sensitive to contaminants at the surface of the silicon substrate 56, which results in the generation of defects of a subsequently-formed nickel silicide. It also is believed that the presence of the buffer layer 100 may reduce sensitivity of the nickel or other second silicide-forming metal 88 to surface contaminants.

Figure 6:
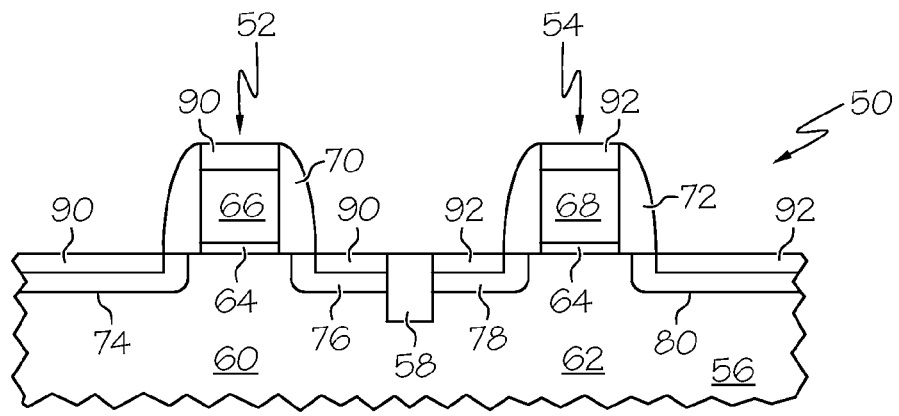

Referring to FIG. 6, silicide forms only in those areas where there is exposed silicon in contact with the silicide-forming metals. Silicide does not form, and the silicide-forming metals remain unreacted in those areas where there is no exposed silicon such as on the sidewall spacers, on the insulating layer 84, and the exposed STI 58. The unreacted silicide-forming metals and the insulating layer 84 can be removed by wet etching in a $H_2O_2/H_2SO_4$, $HNO_3/HCl$, or aqua regia ($H_2O$, HCl, and $HNO_3$) solutions.

Accordingly, CMOS integrated circuit 50 is formed having a first silicide 90 that exhibits low contact resistance to the N-type doped source and drain regions 74 and 76 and to the N-type doped gate electrode 66 and a second silicide 92 that exhibits low contact resistance to the P-type doped source and drain regions 78 and 80 and to the P-type doped gate electrode 68. Further, the first and second silicides are formed during the same annealing process, thus reducing processing time and cost. While the above-described embodiments were illustrated with a first silicide-forming metal that exhibits a low barrier height with respect to N-type doped silicon and that is used to form buffer layer 100 overlying PMOS transistor 54, it will be appreciated that the reverse can be performed with the first silicide-forming metal exhibiting a low barrier height with respect to P-type doped silicon and forming a buffer layer 100 overlying the NMOS transistor 52.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a CMOS integrated circuit including an NMOS transistor disposed in and on a silicon-comprising substrate and a PMOS transistor disposed in and on the substrate, the method comprising the steps of:
    depositing a first silicide-forming metal on the NMOS and PMOS transistors, wherein the first silicide-forming metal forms a silicide at a first temperature;
    forming a buffer layer of the first silicide-forming metal on one of the NMOS and PMOS transistors;
    forming an insulating layer overlying first silicide-forming metal of the other of the NMOS and PMOS transistors;
    depositing a second silicide-forming metal overlying the NMOS and PMOS transistors, wherein the second silicide-forming metal forms a silicide at a second temperature that is different from the first temperature; and
    heating the first silicide-forming metal and the second silicide-forming metal at a temperature that is no less than the higher of the first temperature and the second temperature.

2. The method of claim 1, wherein the step of forming a buffer layer comprises the steps of removing substantially all of the first silicide-forming metal from the one of the NMOS and PMOS transistors and regrowing a buffer layer of the first silicide-forming metal overlying the one of the NMOS and PMOS transistors.

3. The method of claim 2, wherein the step of regrowing a buffer layer of the first silicide-forming metal comprises the step of regrowing the buffer layer of the first silicide-forming metal to a thickness in a range of about 0.5 nm to about 2 nm.

4. The method of claim 1, wherein the step of depositing a first silicide-forming metal on the NMOS and PMOS transistors comprises the step of depositing a silicide-forming metal that exhibits a barrier height with respect to N-type silicon that is lower than the barrier height of nickel with respect to N-type silicon.

5. The method of claim 4, wherein the step of depositing a first silicide-forming metal that exhibits a barrier height with respect to N-type silicon that is lower than the barrier height of nickel with respect to N-type silicon comprises the step of depositing a silicide-forming metal that exhibits a barrier height with respect to N-type silicon that is lower than 0.4 eV.

6. The method of claim 1, wherein the step of depositing a first silicide-forming metal on the NMOS and PMOS transistors comprises the step of depositing a silicide-forming metal comprising a material selected from the group consisting of dysprosium (Dy), erbium (Eb), holmium (Ho), lutetium (Lu), gadolinium (Gd), terbium (Tb), ytterbium (Yb), and yttrium (Y).

7. The method of claim 1, wherein the step of depositing a first silicide-forming metal on the NMOS and PMOS transistors comprises the step of depositing the first silicide-forming metal to a thickness in a range of about 5 nm to about 40 nm on the NMOS and PMOS transistors.

8. The method of claim 1, wherein the step of forming a buffer layer comprises the step of removing a portion of the first silicide-forming metal from the one of the NMOS and PMOS transistors, leaving a remaining buffer layer of the first silicide-forming metal having a thickness in a range of about 0.5 nm to about 2 nm on the one of the NMOS and PMOS transistors.

9. The method of claim 1, wherein the step of depositing a second silicide-forming metal overlying the NMOS and PMOS transistors comprises the step of depositing a second silicide-forming metal that exhibits a barrier height with respect to P-type silicon that is no less than about 0.6 eV.

10. The method of claim 1, wherein the step of depositing a second silicide-forming metal overlying the NMOS and PMOS transistors comprises depositing a second silicide-forming metal comprising a material selected from the group consisting of iridium (Ir), osmium (Os), platinum (Pt), nickel (Ni), and alloys thereof.

11. A method for fabricating a CMOS integrated circuit including an NMOS transistor having N-type source and drain regions and a PMOS transistor having P-type source and drain regions, the method comprising the steps of:
    forming a first silicide-forming metal contacting the N-type source and drain regions and the P-type source and drain regions;
    depositing a insulating layer overlying the first silicide-forming metal;
    forming a patterned mask overlying one type of the N-type source and drain regions and the P-type source and drain regions;
    removing the insulating layer from the other type of the N-type source and drain regions and the P-type source and drain regions;
    forming a buffer layer of the first silicide-forming metal on the other type of the N-type source and drain regions and the P-type source and drain regions;
    forming a second silicide-forming metal overlying the insulating layer and the buffer layer, wherein the second silicide-forming metal forms a metal silicide at a second temperature that is lower than a first temperature at which the first silicide-forming metal forms a metal silicide; and
    heating the first silicide-forming metal and the second silicide-forming metal at a temperature that is no less than the first temperature.

12. The method of claim 11, wherein the step of forming a first silicide-forming metal contacting the N-type source and drain regions and the P-type source and drain regions comprises the step of forming a silicide-forming metal that exhibits a barrier height with respect to N-type silicon that is lower than 0.4.

13. The method of claim 12, wherein the step of forming a silicide-forming metal that exhibits a barrier height with respect to N-type silicon that is lower than 0.4 eV comprises the step of forming a silicide-forming metal comprising a material selected from the group consisting of dysprosium (Dy), erbium (Eb), holmium (Ho), lutetium (Lu), gadolinium (Gd), terbium (Tb), ytterbium (Yb), and yttrium (Y).

14. The method of claim 11, wherein the step of forming a buffer layer of the first silicide-forming metal on the other type of the N-type source and drain regions and the P-type source and drain regions comprises the step of removing a portion of the first silicide-forming metal.

15. The method of claim 11, wherein the step of forming a buffer layer of the first silicide-forming metal on the other type of the N-type source and drain regions and the P-type source and drain regions comprises the step of removing at least substantially all of the first silicide-forming metal on the other type of the N-type source and drain regions and the P-type source and drain regions and regrowing the buffer layer of the first silicide-forming metal.

16. The method of claim 11, wherein the step of forming a second silicide-forming metal overlying the insulating layer and the buffer layer comprises the step of forming a second silicide-forming metal comprising a material selected from the group consisting of iridium (Ir), osmium (Os), platinum (Pt), nickel (Ni), and alloys thereof.

17. The method of claim 11, wherein the step of forming a buffer layer of the first silicide-forming metal on the other type of the N-type source and drain regions and the P-type source and drain regions comprises the step of forming a buffer layer having a thickness in a range of about 0.5 nm to about 2 nm.

18. A method for fabricating a CMOS integrated circuit having an NMOS transistor disposed in and on a silicon-comprising substrate and a PMOS transistor disposed in and on the substrate, the method comprising the steps of:
  depositing a first silicide-forming metal on the NMOS and PMOS transistors, wherein the first silicide-forming metal forms a metal silicide at a first temperature;
  depositing an insulating layer overlying the first silicide-forming metal;
  forming a mask overlying the NMOS transistor;
  removing the insulating layer overlying the PMOS transistor;
  forming a buffer layer of the first silicide-forming metal overlying the PMOS transistor;
  removing the mask;
  forming a second silicide-forming metal overlying the insulating layer and the buffer layer, wherein the second silicide-forming metal forms a metal silicide at a second temperature that is lower than the first temperature; and
  heating the first silicide-forming metal and the second silicide-forming metal at a temperature no less than the first temperature.

19. The method of claim 18, wherein the step of depositing a first silicide-forming metal on the NMOS and PMOS transistors comprises the step of depositing a silicide-forming metal comprising a material selected from the group consisting of dysprosium (Dy), erbium (Eb), holmium (Ho), lutetium (Lu), gadolinium (Gd), terbium (Tb), ytterbium (Yb), and yttrium (Y).

* * * * *